(12) United States Patent
Saito

(10) Patent No.: US 7,496,334 B2
(45) Date of Patent: Feb. 24, 2009

(54) TRANSMITTER APPARATUS AND WIRELESS COMMUNICATION APPARATUS

(75) Inventor: Noriaki Saito, Tokyo (JP)

(73) Assignee: Panasonic Corporation, Osaka (JP)

( * ) Notice: Subject to any disclaimer, the term of this patent is extended or adjusted under 35 U.S.C. 154(b) by 395 days.

(21) Appl. No.: 10/598,434

(22) PCT Filed: Feb. 25, 2005

(86) PCT No.: PCT/JP2005/003195

§ 371 (c)(1),
(2), (4) Date: Aug. 30, 2006

(87) PCT Pub. No.: WO2005/083891

PCT Pub. Date: Sep. 9, 2005

(65) Prior Publication Data

US 2007/0147541 A1      Jun. 28, 2007

(30) Foreign Application Priority Data

Mar. 1, 2004  (JP)  ............................. 2004-055913
Dec. 17, 2004  (JP)  ............................. 2004-365578

(51) Int. Cl.
  *H04B 1/04*  (2006.01)
(52) U.S. Cl. .................. 455/114.3; 455/115.2; 375/296
(58) Field of Classification Search .............. 455/114.2, 455/114.3, 115.1, 115.2, 127.2, 127.3; 375/296, 375/297, 298; 330/149
See application file for complete search history.

(56) References Cited

U.S. PATENT DOCUMENTS

| 7,126,999 B2 * | 10/2006 | Dent | .......................... 375/261 |
| 2005/0210354 A1 * | 9/2005 | Kurokami | .................... 714/747 |
| 2005/0226346 A1 * | 10/2005 | Ode et al. | .................... 375/296 |

FOREIGN PATENT DOCUMENTS

| JP | 3024515 | 1/2000 |
| JP | 3044057 | 3/2000 |
| JP | 2002-500846 | 1/2002 |
| JP | 2002-135062 | 5/2002 |

\* cited by examiner

*Primary Examiner*—Nguyen Vo
(74) *Attorney, Agent, or Firm*—Pearne & Gordon LLP

(57) ABSTRACT

A transmitter capable of carrying out a highly efficient polar coordinate modulation while maintaining an excellent distortion characteristic. When a high power amplifier is operated in a saturation mode to carry out a polar coordinate modulation, a switching control signal is set to be a multiplication, and a quadrature modulating digital signal and distortion data of a compensation table are multiplied, thereby adding a nonlinear distortion equivalent to that of the amplifier in a linear mode and compressing a peak factor of a modulating signal to enhance an efficiency of the polar coordinate modulation. When the amplifier is operated in the linear mode to carry out a linear amplification, the switching control signal is set to be a division and the quadrature modulating digital signal and the distortion data are divided, thereby adding a reverse distortion characteristic of the amplifier to carry out a nonlinear distortion compensation of the amplifier.

17 Claims, 10 Drawing Sheets

| INPUT LEVEL | DISTORTION DATA (OUTPUT LEVEL) | DISTORTION DATA (PHASE) |
|---|---|---|
| --- | --- | --- |

FIG. 5

| NORMAL CHARACTERISTIC | | |
|---|---|---|
| INPUT LEVEL | DISTORTION DATA (OUTPUT LEVEL) | DISTORTION DATA (PHASE) |
| --- | --- | --- |
| REVERSE CHARACTERISTIC | | |
| INPUT LEVEL | DISTORTION DATA (OUTPUT LEVEL) | DISTORTION DATA (PHASE) |
| --- | --- | --- |

NORMAL CHARACTERISTIC

REVERSE CHARACTERISTIC

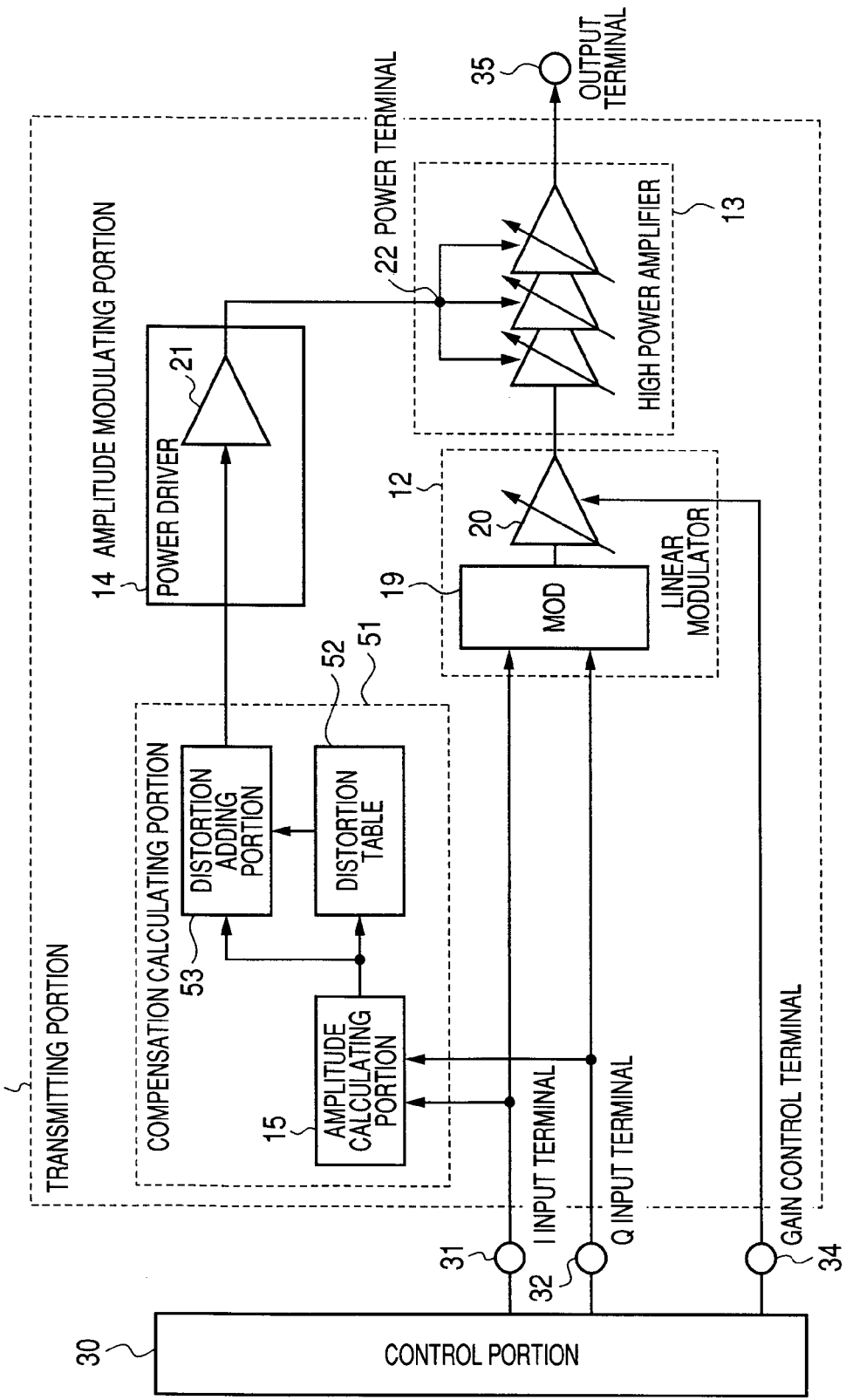

| INPUT LEVEL | DISTORTION DATA (OUTPUT LEVEL) |
|---|---|
| --- | --- |

TRANSMITTER APPARATUS AND WIRELESS COMMUNICATION APPARATUS

TECHNICAL FIELD

The present invention relates to a transmitter capable of amplifying a transmission power using a polar coordinate modulation and a radio communicating device using the transmitter.

BACKGROUND ART

In a transmitter to be used in mobile telecommunications, a power efficiency and a linearity in a transmitting function are evaluated as an index for indicating a performance of the device. In particular, the power efficiency and the linearity in the transmitting function are the most important indices for representing the performance of the device in a high frequency modulation transmitting apparatus such as a cell phone.

For an amplifier in a final stage of the high frequency modulation transmitting apparatus, an amplifier for carrying out a so-called AB class operation has widely been used. The AB class amplifier has a small distortion, that is, is excellent in the linearity. On the other hand, a power with a DC bias component is always consumed. For this reason, a power efficiency is reduced.

For a method of operating a power amplifier with a high efficiency, therefore, there has been designed a polar coordinate modulating method for changing and amplifying a drain voltage or a collector voltage (a source voltage) corresponding to an amplitude component of a baseband signal by using a saturation region of an input/output characteristic of a transistor. Examples of the device of this type include an output variable transmitter disclosed in Japanese Patent No. 3044057 (Patent Document 1).

FIG. 12 is a block diagram showing a structure of an output variable transmitter according to a related example. The output variable transmitter has such a structure as to include modulating input terminals 101 and 102, a carrier oscillator 104, a quadrature modulator 103 for quadraturely modulating outputs of the modulating input terminals 101 and 102 at an output frequency of the carrier oscillator 104, a high frequency power amplifier 105, a transmitting output terminal 106, an envelope generating circuit 107 for generating an envelope from the outputs of the modulating input terminals 101 and 102, a specifying signal input terminal 112, a multiple-valued DC signal generating circuit 108 for inputting a signal for setting an average output level of the power amplifier 105 which is sent from the specifying signal input terminal 112 and generating a DC signal corresponding to an input value thereof, a multiplying circuit 109 for multiplying an output envelope of the envelope generating circuit 107 by an output of the multi-valued DC signal generating circuit 108, a voltage control circuit 110 for controlling a drain voltage of the power amplifier 105 corresponding to an output of the multiplying circuit 109, and a power terminal 111.

The quadrature modulator 103 modulates a carrier supplied from the carrier oscillator 104 in response to an I signal input from the modulating input terminals 101 and 102 and a Q signal which is quadrature to the I signal. The envelope generating circuit 107 calculates an amplitude signal R of the I and Q signals. An output level specifying signal corresponding to a transmitting output level which is to be output to the transmitting output terminal 106 is input to the specifying signal input terminal 112. The multiple-valued DC signal generating circuit 108 generates a DC signal in accordance with the output level specifying signal sent from the specifying signal input terminal 112.

The multiplying circuit 109 multiplies an output of the envelope generating circuit 107 by that of the multiple-valued DC signal generating circuit 108. Consequently, a signal which is proportional to an envelope of a modulation wave is obtained from the output of the multiplying circuit 109. The voltage control circuit 110 changes a drain voltage Vo of the power amplifier 105 in response to the output of the multiplying circuit 109. As a result, the drain voltage of the power amplifier 105 is proportional to the envelope of the modulation wave. By using the structure of the polar coordinate modulating method, accordingly, the power amplifier 105 can carry out a linear amplification while maintaining a saturation state having a high efficiency.

In the output variable transmitter using the polar coordinate modulating method according to the related example shown in FIG. 12, however, a saturation output is always reduced corresponding to a peak factor to be a ratio of a peak power to an average power. As a result, there is a problem in that the efficiency is deteriorated.

As means for solving the problem, there has been designed a method of multiplying a scaling factor to reduce the peak of the modulation wave when an instantaneous value of an amplitude exceeds a certain value. Examples of an apparatus of this type include a transmission wave generating method and apparatus disclosed in Japanese Patent No. 3024515 (Patent Document 2).

The following (1) and (2) are equations for explaining an operation of the transmission wave generating method and apparatus according to the related example.

$$I(t) = R\max \times I\text{in}(t)/R\text{in}(t) \quad (1)$$

$$Q(t) = R\max \times Q\text{in}(t)/R\text{in}(t) \quad (2)$$

In the equations, Iin(t) and Qin(t) represent a quadrature modulating input signal, Rmax represents an amplitude limit value, and Rin(t) represents an estimated amplitude value calculated from Iin(t) and Qin(t).

In the related example, the estimated amplitude value Rin(t) is compared with the amplitude limit value Rmax. If Rin(t) is smaller than Rmax, the input signals Iin(t) and Qin(t) are exactly used. If Rin(t) is equal to or greater than Rmax, a peak of a modulating signal is reduced in accordance with the equations (1) and (2).

In the transmission wave generating method and apparatus according to the related example, however, an amplitude limitation is carried out only when an instantaneous value of an amplitude is greater than the amplitude limit value (a hard clipping operation) so that a rapid change is generated in the vicinity of the amplitude limit value. As a result, there is a problem in that a nonlinear distortion is easily increased.

Patent Document 1: Japanese Patent No. 3044057 (Pages 1 to 20, FIG. 1)

Patent Document 2: Japanese Patent No. 3024515 (Page 3, Equation 3)

DISCLOSURE OF THE INVENTION

Problems to be Solved by the Invention

The invention has been made in consideration of the circumstances and has an object to provide a transmitter and a radio communicating device which can carry out a polar coordinate modulation with a high efficiency while maintaining an excellent distortion characteristic.

Means for Solving the Problems

A transmitter according to the invention comprises amplitude calculating means for calculating an amplitude of an input modulating signal, distortion compensation data storage means for storing distortion data on a normal characteristic or a reverse characteristic to carry out a distortion compensation for the input modulating signal, distortion compensating means for reading the distortion data on the normal characteristic or the reverse characteristic from the distortion compensation data storage means based on an output of the amplitude calculating means and multiplying or dividing the input modulating signal and the distortion data to carry out the distortion compensation, quadrature modulating means for carrying out a quadrature modulation in response to an output of the distortion compensating means, variable gain amplifying means for amplifying an output of the quadrature modulating means to control a gain based on a gain control signal, power amplifying means serving to carry out a power amplification for an output of the variable gain amplifying means and having a linear mode for carrying out the power amplification by using a linear operating region in an input/output power characteristic and a saturation mode for carrying out the power amplification by using a saturation operating region in the input/output power characteristic, and amplitude modulating means for inputting an amplitude component of the output of the distortion compensating means to an output controlling input terminal of the power amplifying means, thereby carrying out a polar coordinate modulation, wherein the input modulating signal and the distortion data on the normal characteristic are multiplied or the input modulating signal and the distortion data on the reverse characteristic are divided in the distortion compensating means in the case in which the power amplifying means is operated in the saturation mode to carry out the polar coordinate modulation, and the input modulating signal and the distortion data on the normal characteristic are divided or the input modulating signal and the distortion data on the reverse characteristic are multiplied in the distortion compensating means in the case in which the power amplifying means is operated in the linear mode to carry out a linear amplification.

By this structure, in the case in which the operation is carried out in the saturation mode to perform the polar coordinate modulation, the input modulating signal and the distortion data are multiplied when the distortion data have the normal characteristic and they are divided when the distortion data have the reverse characteristic. Consequently, it is possible to add an equivalent nonlinear distortion to that in the operation in the linear mode, thereby carrying out a distortion compensation, for example. Thus, it is possible to carry out the polar coordinate modulation with a high efficiency in a state in which a peak factor of a modulating signal is reduced. In the case in which the operation is carried out in the linear mode to perform the linear amplification, moreover, the input modulating signal and the distortion data are divided when the distortion data have the normal characteristic and they are multiplied when the distortion data have the reverse characteristic. Consequently, it is possible to add a reverse distortion characteristic of the power amplifying means, thereby carrying out a nonlinear distortion compensation, for example. Thus, it is possible to carry out the polar coordinate modulation with a high efficiency while maintaining an excellent distortion characteristic.

A transmitter according to the invention comprises amplitude calculating means for calculating an amplitude of an input modulating signal, normal and reverse distortion compensation data storage means for storing distortion data on a normal characteristic and a reverse characteristic to carry out a distortion compensation for the input modulating signal, distortion compensating means for reading the distortion data on the normal characteristic or the reverse characteristic from the normal and reverse distortion compensation data storage means based on an output of the amplitude calculating means and multiplying the input modulating signal and the distortion data to carry out the distortion compensation, quadrature modulating means for carrying out a quadrature modulation in response to an output of the distortion compensating means, variable gain amplifying means for amplifying an output of the quadrature modulating means to control a gain based on a gain control signal, power amplifying means serving to carry out a power amplification for an output of the variable gain amplifying means and having a linear mode for carrying out the power amplification by using a linear operating region in an input/output power characteristic and a saturation mode for carrying out the power amplification by using a saturation operating region in the input/output power characteristic, and amplitude modulating means for inputting an amplitude component of the output of the distortion compensating means to an output controlling input terminal of the power amplifying means, thereby carrying out a polar coordinate modulation, wherein the input modulating signal and the distortion data on the normal characteristic are multiplied in the distortion compensating means in the case in which the power amplifying means is operated in the saturation mode to carry out the polar coordinate modulation, and the input modulating signal and the distortion data on the reverse characteristic are multiplied in the distortion compensating means in the case in which the power amplifying means is operated in the linear mode to carry out a linear amplification.

By this structure, in the case in which the operation is carried out in the saturation mode to perform the polar coordinate modulation, the input modulating signal and the distortion data on the normal characteristic are multiplied. Consequently, it is possible to add an equivalent nonlinear distortion to that in the operation in the linear mode, thereby carrying out a distortion compensation, for example. Thus, it is possible to carry out the polar coordinate modulation with a high efficiency in a state in which a peak factor of a modulating signal is reduced. In the case in which the operation is carried out in the linear mode to carry out the linear amplification, moreover, the input modulating signal and the distortion data on the reverse characteristic are multiplied. Consequently, it is possible to add a reverse distortion characteristic of the power amplifying means, thereby carrying out a nonlinear distortion compensation, for example. Thus, it is possible to carry out the polar coordinate modulation with a high efficiency while maintaining an excellent distortion characteristic. Furthermore, it is possible to constitute the distortion compensating means by only a multiplying function without using a multibit division having a heavy processing in ASIC. Consequently, it is possible to simplify a structure of the distortion compensating means and to relieve a processing load.

A transmitter according to the invention comprises quadrature modulating means for inputting an in-phase component and a quadrature component of an input modulating signal, thereby carrying out a quadrature modulation, variable gain amplifying means for amplifying an output of the quadrature modulating means to control a gain based on a gain control signal, power amplifying means serving to carry out a power amplification for an output of the variable gain amplifying means and having a linear mode for carrying out the power amplification by using a linear operating region in an input/output power characteristic and a saturation mode for carrying out the power amplification by using a saturation operating region in the input/output power characteristic, amplitude calculating means for calculating an amplitude of the input modulating signal, amplitude modulating means for inputting an amplitude component of the input modulating signal to an output controlling input terminal of the power amplifying means, thereby carrying out a polar coordinate modulation, amplitude distortion data storage means for storing distortion data for the amplitude of the input modulating signal, and distortion adding means for reading the distortion data from the amplitude distortion data storage means based on an output of the amplitude calculating means and multiplying the amplitude of the input modulating signal and the distortion data in the case in which the power amplifying means is operated in the saturation mode to carry out the polar coordinate modulation.

By this structure, in the case in which the operation is carried out in the saturation mode to perform the polar coordinate modulation, the amplitude of the input modulating signal and the distortion data are multiplied and the amplitude component having the distortion added thereto is input to the output controlling input terminal of the power amplifying means, thereby performing the polar coordinate modulation. Thus, it is possible to carry out the distortion compensation of the power amplifying means. By using only the distortion data for the amplitude, moreover, it is possible to simplify a structure of the amplitude distortion data storage means. Furthermore, it is possible to simplify a structure of a circuit without carrying out the distortion compensation in the linear mode.

A transmitter according to the invention comprises quadrature modulating means for inputting an in-phase component and a quadrature component of an input modulating signal, thereby carrying out a quadrature modulation, first variable gain amplifying means for a distortion control which serves to amplify an output of the quadrature modulating means, thereby controlling a gain based on a distortion control signal, second variable gain amplifying means for a gain control which serves to amplify an output of the first variable gain amplifying means, thereby controlling a gain based on a gain control signal, power amplifying means serving to carry out a power amplification for an output of the second variable gain amplifying means and having a linear mode for carrying out the power amplification by using a linear operating region in an input/output power characteristic and a saturation mode for carrying out the power amplification by using a saturation operating region in the input/output power characteristic, amplitude detecting means for detecting an amplitude of the output of the first variable gain amplifying means, and amplitude modulating means for inputting an output of the amplitude detecting means to an output controlling input terminal of the power amplifying means, thereby carrying out a polar coordinate modulation.

By this structure, the nonlinear distortion is given on an analog basis by the first variable gain amplifying means. Consequently, it is possible to carry out the distortion compensation. In this case, it is not necessary to provide means for storing the distortion data. Therefore, it is possible to simplify the structure of the circuit.

A transmitter according to the invention comprises a polar coordinate transforming portion for transforming an input modulating signal constituted by an in-phase component and a quadrature component into an amplitude signal and a phase signal, distortion data storage means for storing distortion data to add a distortion to the amplitude signal and the phase signal, distortion adding means for reading the distortion data from the distortion data storage means based on the amplitude signal and adding a distortion to the amplitude signal and the phase signal, distortion compensation data storage means for storing two types of distortion data to carry out a distortion compensation for amplitude signal and phase signal outputs of the distortion adding means, distortion compensating means for selecting and reading any of the distortion data from the distortion compensation data storage means based on the amplitude signal output of the distortion adding means and carrying out a distortion compensation for the amplitude signal and phase signal outputs of the distortion adding means, rectangular coordinate transforming means for transforming any of an amplitude signal output of the distortion compensating means, a fixed value output and the amplitude signal output of the distortion adding means and a phase signal output of the distortion compensating means into an in-phase component and a quadrature component, quadrature modulating means for carrying out a quadrature modulation in response to an output of the rectangular coordinate transforming means, variable gain amplifying means for amplifying an output of the quadrature modulating means to control a gain based on a gain control signal, power amplifying means serving to carry out a power amplification for an output of the variable gain amplifying means and having a linear mode for carrying out the power amplification by using a linear operating region in an input/output power characteristic and a saturation mode for carrying out the power amplification by using a saturation operating region in the input/output power characteristic, and amplitude modulating means for inputting an amplitude component of the output of the distortion compensating means to an output controlling input terminal of the power amplifying means, thereby carrying out a polar coordinate modulation, wherein an amplitude signal input to the rectangular coordinate transforming means is set to be the fixed value or the amplitude output in the distortion adding means in the case in which the power amplifying means is operated in the saturation mode to carry out the polar coordinate modulation, and is set to be the amplitude output in the distortion compensating means in the case in which the power amplifying means is operated in the linear mode to carry out a linear amplification.

By this structure, it is possible to reduce the peak factor of the modulating signal also in the linear modulation in addition to the polar coordinate modulation. Thus, it is possible to further increase the efficiency.

In the transmitter according to the invention, when the power amplifying means is to be operated in the saturation mode to carry out the polar coordinate modulation, the amplitude signal input to the rectangular coordinate transforming means is set to be a fixed value if an operating mode is a cellular system communication and is set to be an amplitude output in the distortion adding means in case of a WLAN system communication.

By this structure, it is possible to suppress an upper limit of an operating frequency of DAC provided in an output of the rectangular coordinate transforming portion in a WLAN system communication having a large transmission band, for example, a high speed WLAN (Wireless Local Area Network: IEEE802.11a/b/g), and to satisfy strict modulation spectrum specifications of 60 dBc in 600 KHz detuning in a cellular system communication having a small transmission band, for example, a radio communication using a cellular method, for example, GSM or EDGE.

In the transmitter according to an embodiment of the invention, moreover, the power amplifying means carries out the polar coordinate modulation when a transmitting output power is on a maximum output level or in the vicinity thereof, and carries out the linear amplification when the transmitting output power is lower than the transmitting power.

By this structure, a highly efficient polar coordinate modulation can be carried out in a state in which the peak factor of the modulating signal is reduced in the vicinity of a maximum output level of the transmitting output power, and a linear amplification can be performed with the execution of a nonlinear distortion compensation in a smaller transmitting output power. Therefore, it is possible to carry out a highly efficient amplification through the polar coordinate modulation in the vicinity of the maximum output level while maintaining an excellent distortion characteristic and to control a transmitting output on an output level within a wide range by the linear amplification if the output level is low.

In the transmitter according to an embodiment of the invention, furthermore, the power amplifying means comprises a power terminal to be used as the output controlling input terminal, and the transmitter further comprises a power driver which serves to increase a current capacity of the signal on the predetermined level or a signal subjected to an amplitude modulation based on the amplitude component of the input modulating signal and to supply a power as a transmitting output control signal to the power terminal.

By this structure, the current capacity of the signal subjected to the amplitude modulation based on the amplitude component of the input modulating signal is increased by means of the power driver and is supplied as a transmitting output control signal to the power terminal of the power amplifying means. Consequently, it is possible to carry out a highly efficient polar coordinate modulation in the saturation mode.

In addition, the invention provides a radio communicating device comprising any of the transmitters. In the radio communicating device having such a structure, it is possible to carry out an amplification by a highly efficient polar coordinate modulation in a state in which the peak factor of the modulating signal is reduced in the case in which the operation is performed in the saturation mode, and to carry out a linear amplification while performing the nonlinear distortion compensation in the case in which the operation is performed in the linear mode. Thus, the device is more effective for an application to a small-sized mobile radio communicating device such as a cell phone.

ADVANTAGE OF THE INVENTION

According to the invention, it is possible to provide a transmitter capable of carrying out a highly efficient polar coordinate modulation while maintaining an excellent distortion characteristic, and a radio communicating device.

BRIEF DESCRIPTION OF THE DRAWINGS

[FIG. 5] A diagram showing an example of a structure of a compensation table to be used in the second embodiment.

[FIG. 7] A block diagram showing a structure of a transmitter according to a third embodiment of the invention.

Figure 1:
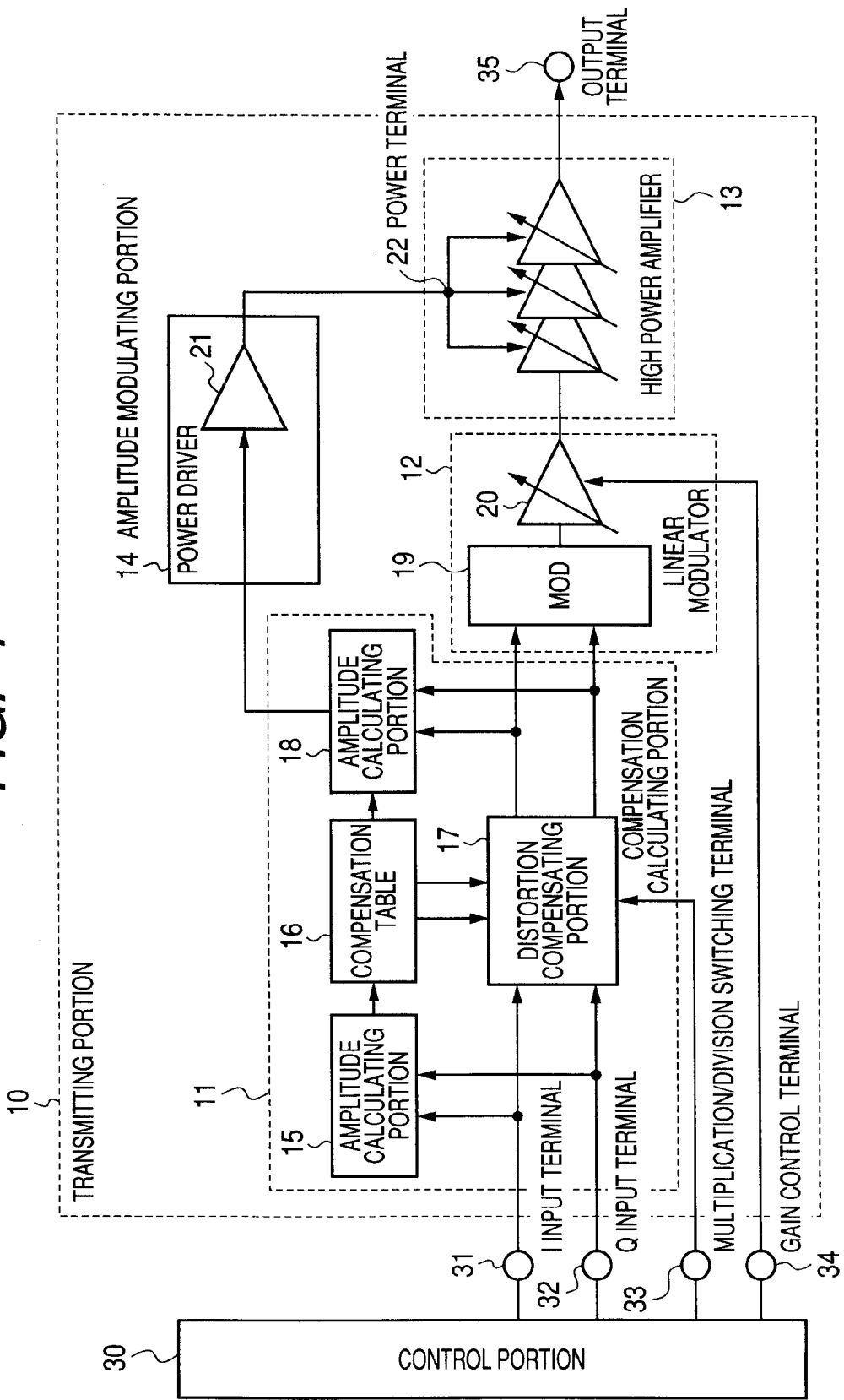
[FIG. 1] A block diagram showing a structure of a transmitter according to a first embodiment of the invention.

DESCRIPTION OF REFERENCE NUMERALS 10, 40, 50, 60 transmitting portion
11, 41, 51 compensation calculating portion
12 linear modulator
13 high power amplifier
14 amplitude modulating portion
15 first amplitude calculating portion
16, 42 compensation table
17 distortion compensating portion
18 second amplitude calculating portion
19 quadrature modulator
20, 61 medium power amplifier
21 power driver
22 power terminal
30 control portion
31 I input terminal
32 Q input terminal
33 multiplication/division switching terminal
34 gain control terminal
35 output terminal
43 normal/reverse characteristic switching terminal
52 distortion table
53 distortion adding portion
62 amplitude detecting portion
63 distortion control terminal
200 transmitting portion
201 compensation calculating portion
202 mode switching terminal
203 first fixed value output terminal
204 second fixed value output terminal
205 polar coordinate transforming portion
206 distortion table
207 distortion adding portion
208 distortion compensating portion
209 compensation table
210 rectangular coordinate transforming portion
211 second selecting portion
212 first selecting portion
101, 102 modulating input terminal
103 quadrature modulator
104 carrier oscillator
105 high frequency power amplifier
106 transmitting output terminal
107 envelope generating circuit
108 multiple-valued DC signal generating circuit
109 multiplying circuit
110 voltage control circuit
111 power terminal

BEST MODE FOR CARRYING OUT THE INVENTION

First Embodiment

FIG. 1 is a block diagram showing a structure of a transmitter according to a first embodiment of the invention. A transmitting portion 10 constituting the transmitter according to the first embodiment is constituted to include a compensation calculating portion 11 for calculating a distortion compensation, a linear modulator 12, a high power amplifier 13 for amplifying a power of a transmitting signal output from the linear modulator 12, and an amplitude modulating portion 14 for generating a power to be supplied to the high power amplifier 13.

The compensation calculating portion 11 is constituted to have a first amplitude calculating portion 15 for calculating an amplitude of a baseband zone quadrature modulating digital signal, a compensation table 16 for storing distortion data on a normal characteristic or a reverse characteristic of an output level and a phase corresponding to each input level of the high power amplifier 13, a distortion compensating portion 17 for multiplying or dividing and outputting the baseband zone quadrature modulating digital signal and the distortion data of the compensation table 16 in accordance with a switching control signal, and a second amplitude calculating portion 18 for calculating an amplitude obtained after the distortion compensation from an output signal of the distortion compensating portion 17.

Figures 2, 3:
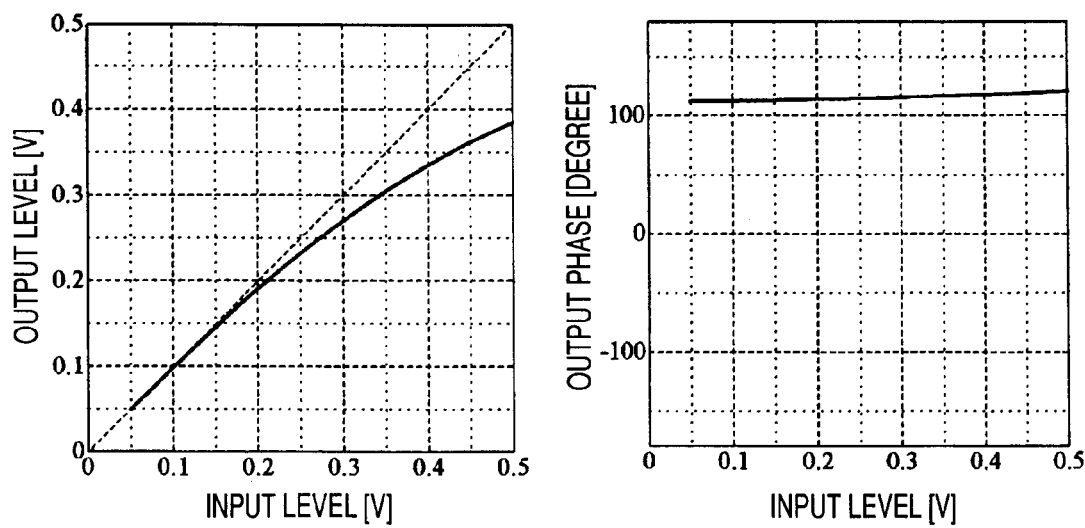
[FIG. 2] A diagram showing an example of a structure of a compensation table to be used in the first embodiment.
[FIG. 3] A characteristic chart showing, in a graph, an example of data to be stored in the compensation table according to the first embodiment.

FIG. 2 is a diagram showing an example of a structure of the compensation table 16 to be used in the first embodiment, and FIG. 3 is a characteristic chart showing, in a graph, an example of the normal characteristic data to be stored in the compensation table 16 in FIG. 2. The compensation table 16 corresponds to an example of compensation data storage means and stores the distortion data on the output level and the phase corresponding to each input level of the high power amplifier 13. By referring to the compensation table 16 with the amplitude of the quadrature modulating digital signal calculated by the amplitude calculating portion 15 set to be an index, it is possible to obtain distortion data representing a nonlinear distortion characteristic of the high power amplifier 13.

The linear modulator 12 is constituted to have a quadrature modulator (MOD) 19 for quadraturely modulating an output of the distortion compensating portion 17 and converting a frequency into an RF band, and a medium power amplifier 20 for amplifying an output of the quadrature modulator 19. The amplitude modulating portion 14 is constituted to have a power driver 21, and increases a current capacity of an amplitude obtained after a distortion compensation which is output from the amplitude calculating portion 18 and supplies, to the high power amplifier 13, the current capacity to be a power source of which voltage can be changed.

The transmitting portion 10 has an I input terminal 31 to be an in-phase component input terminal, a Q input terminal 32 to be a quadrature component input terminal, a multiplication/division switching terminal 33 for inputting a switching control signal to control an operation of the distortion compensating portion 17, a gain control terminal 34 for inputting a gain control signal to control an amplification gain of the medium power amplifier 20, and an output terminal 35 for outputting a transmitting signal subjected to a power amplification. A control portion 30 is connected to these terminals and outputs a transmitting modulation signal and various control signals, thereby controlling a radio communicating operation.

In the transmitting portion 10, an in-phase envelope component (I signal) and a quadrature envelope component (Q signal) of a quadrature modulating digital signal in a baseband which is to be transmitted are input to the I input terminal 31 and the Q input terminal 32, respectively. The first amplitude calculating portion 15 calculates an amplitude of the quadrature modulating digital signal from the I signal and the Q signal. An output of the first amplitude calculating portion 15 becomes an index of the compensation table 16.

The distortion compensating portion 17 multiplies or divides the quadrature modulating digital signal and distortion data on an output of the compensation table 16 in accordance with an instruction of the switching control signal input from the multiplication/division switching terminal 32. An output of the distortion compensating portion 17 is input to the quadrature modulator 19 and the second amplitude calculating portion 18. The second amplitude calculating portion 18 calculates an amplitude of the quadrature modulating digital signal obtained after a distortion compensation in the distortion compensating portion 17, and an amplitude output is input to the amplitude modulating portion 14.

The quadrature modulator 19 corresponds to an example of quadrature modulating means and quadraturely modulates a high frequency signal supplied from a local oscillator in response to the I and Q signals obtained after the distortion compensation input from the distortion compensating portion 17, thereby generating, from the I and Q signals, a high frequency signal in an RF band having a phase modulated and outputting the high frequency signal. The medium power amplifier 20 corresponds to an example of variable gain amplifying means and amplifies an output signal of the quadrature modulator 19 in a predetermined gain depending on a level of a gain control signal input from the gain control terminal 34. An output of the medium power amplifier 20 becomes an output of the linear modulator 12 and is input as a transmitting modulation signal to the high power amplifier 13.

The high power amplifier 13 corresponds to an example of power amplifying means and includes amplifying circuits in a plurality of stages as shown, for example, and has an output controlled depending on an input level of a power terminal 22 to be an output controlling input terminal. The high power amplifier 13 carries out a linear amplification in a linear mode or an amplitude modulation (a polar coordinate modulation) in a saturation mode over a transmitting modulation signal output from the linear modulator 12, thereby performing a power amplification to output a transmitting signal through the output terminal 34.

In the saturation mode (a polar coordinate modulating method), an input level of the high power amplifier 13 is maintained in a saturation operating region and a current capacity in an amplitude component of a modulating signal output from the second amplitude calculating portion 18 is increased by the power driver 21, and a power is supplied to the high power amplifier 13 to carry out an amplitude modulation over a voltage of the power terminal 22 of the high power amplifier 13, thereby performing a highly efficient polar coordinate modulation.

In the linear mode (a quadrature modulating method) an output level of the medium power amplifier 20, that is, an input level of the high power amplifier 13 is maintained in a linear operating region in response to a gain control signal input through the gain control terminal 34 and a gain control signal to be transmitted to the medium power amplifier 20 or a source voltage of the high power amplifier 13 is varied to control a transmitting power.

In the embodiment, in the case in which the high power amplifier 13 is operated in the saturation mode, a switching control signal to be input from the control portion 30 to the multiplication/division switching terminal 33 is set to be a multiplication, thereby multiplying a baseband quadrature modulating digital signal input from the I input terminal 31 and the Q input terminal 32 by distortion data output from the compensation table 16 in the distortion compensating portion 17. Consequently, a nonlinear distortion which is equivalent to that in the use of the high power amplifier 13 in the linear mode is added to compress a peak factor of a modulating signal. Thus, it is possible to increase an efficiency of a polar coordinate modulation, thereby enhancing a power amplification efficiency.

In the case in which the high power amplifier 13 is operated in the linear mode, moreover, an output of the amplitude modulating portion 14 is fixed and the switching control signal to be input to the multiplication/division switching terminal 33 is set to be a division. Consequently, the baseband quadrature modulating digital signal input through the I input terminal 31 and the Q input terminal 32 is divided by the distortion data output from the compensation table 16 in the distortion compensating portion 17. Thus, a reverse distortion characteristic of the high power amplifier 13 is added to carry out the nonlinear distortion compensation of the high power amplifier 13. As a result, a power amplification efficiency can be enhanced.

Referring to switching of the saturation mode and the linear mode, the high power amplifier 13 is operated in the linear mode when a transmitting output power has a low output which is less than a predetermined value, for example, in use with a smaller output than a maximum transmitting power, and the high power amplifier 13 is operated in the saturation mode, that is, the polar coordinate modulating method when the transmitting output power has a high output which is equal to or more than the predetermined value, for example, in use in the vicinity of the maximum transmitting power.

While the gain control of the high power amplifier 13 is carried out on the power input level in the example of the structure, it may be variable on a gate or base bias input level. While the quadrature modulation to the RF band is carried out by means of the quadrature modulator, moreover, it is apparent that the same modulation may be carried out by phase modulating means such as a direct modulator, an indirect PLL modulator or a ΔΣ modulator used in a constant amplitude modulating system such as a GSM method of European cell phones.

In the first embodiment, thus, in the case in which the high power amplifier 13 is operated in the saturation mode to carry out a highly efficient polar coordinate modulation in the vicinity of a maximum output, the baseband quadrature modulating digital signal which is input and the distortion data of the high power amplifier 13 are multiplied and a nonlinear distortion which is equivalent to that in the use of the high power amplifier 13 in the linear mode is added to compress the peak factor of the modulating signal. In the case in which the high power amplifier 13 is operated in the linear mode on a lower output level, moreover, the baseband quadrature modulating digital signal which is input and the distortion data of the high power amplifier 13 are divided and the reverse distortion characteristic of the high power amplifier 13 is added to carry out a nonlinear distortion compensation. Consequently, it is possible to switch the nonlinear distortion compensation by a highly efficient polar coordinate modulating method and a simple predistortion method.

Second Embodiment

Figure 4:
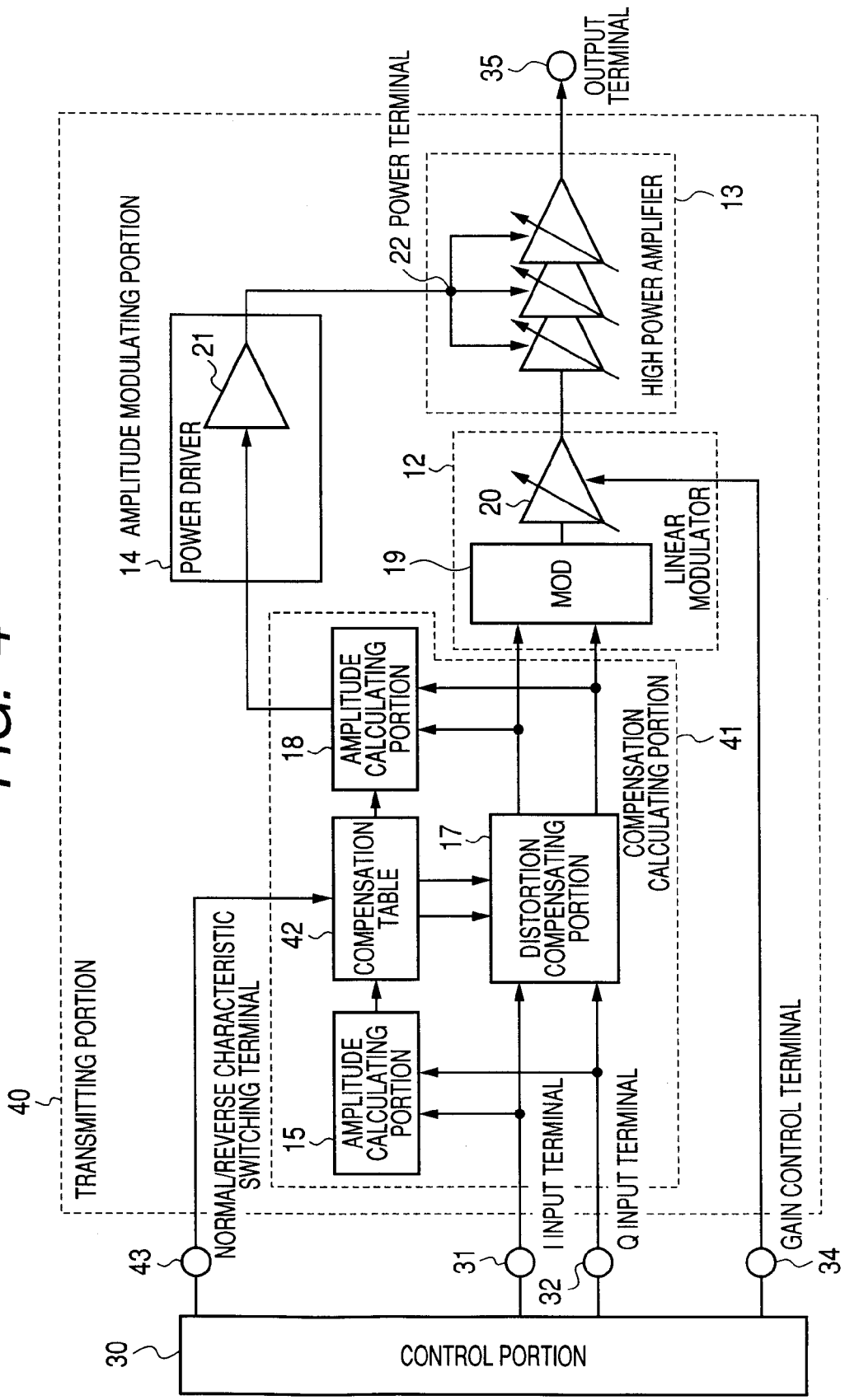
[FIG. 4] A block diagram showing a structure of a transmitter according to a second embodiment of the invention.

FIG. 4 is a block diagram showing a structure of a transmitter according to a second embodiment of the invention. A transmitting portion 40 according to the second embodiment is partially different from the structure according to the first embodiment and a structure of a compensation calculation portion 41 is changed.

The compensation calculating portion 41 includes a compensation table 42 in which distortion data on a normal characteristic and a reverse characteristic are stored as a plurality of distortion data in place of the compensation table 16 according to the first embodiment, and the compensation table 42 is provided with a normal/reverse characteristic switching terminal 43 for inputting a switching control signal. The distortion data to be output from the compensation table 42 are switched in response to the switching control signal input through the normal/reverse characteristic switching terminal 43 and a distortion compensation is carried out by only a multiplying function. The other structures are the same as those in the first embodiment, and the same components have the same reference numerals and description will be omitted.

Figure 6A:
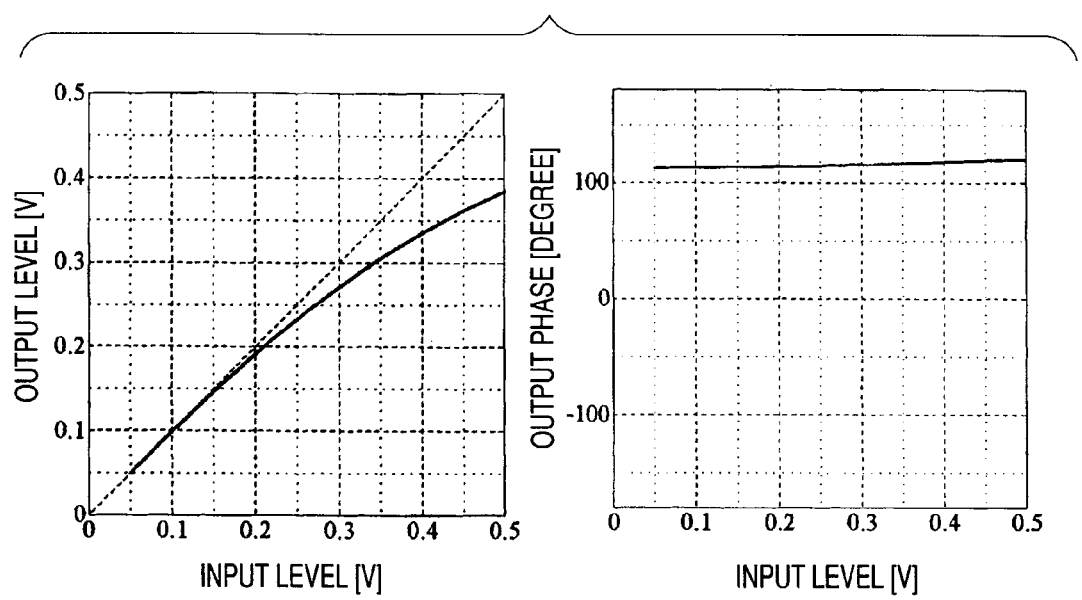
[FIG. 6] A characteristic chart showing, in a graph, an example of data to be stored in the compensation table according to the second embodiment.
Figure 6B:
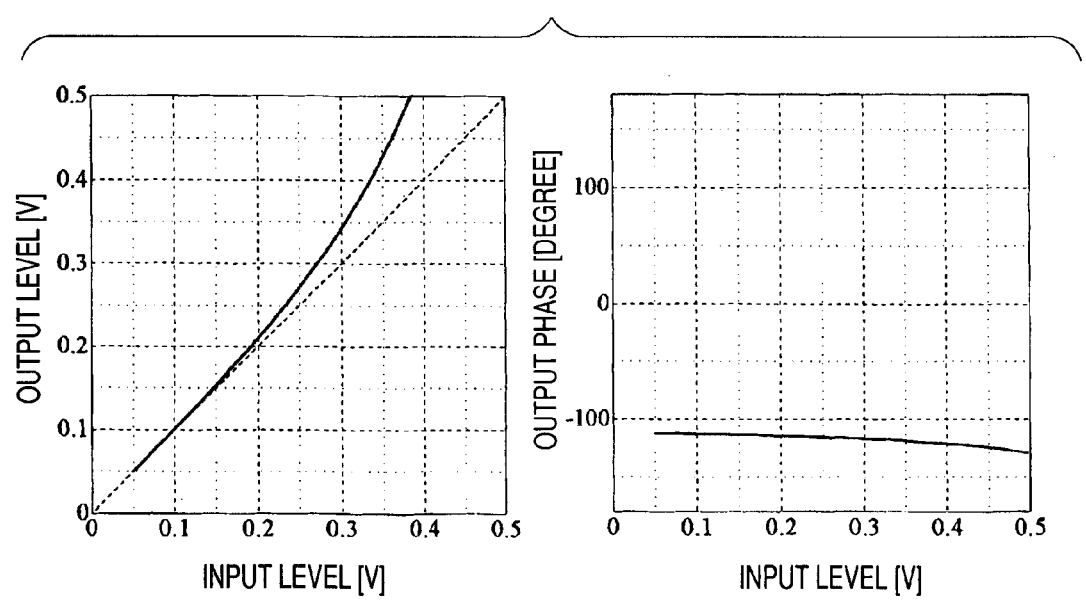

FIG. 5 is a diagram showing an example of a structure of the compensation table 42 to be used in the second embodiment and FIGS. 6(A) and (B) are characteristic charts showing, in graphs, an example of data to be stored in the compensation table 42, and FIG. 6(A) shows a normal characteristic and FIG. 6(B) shows a reverse characteristic. The compensation table 42 is equivalent to an example of compensation data storage means and stores normal characteristic data and reverse characteristic data of distortion data on an output level and a phase which correspond to each input level of a high power amplifier 13. By selecting the normal characteristic data or the reverse characteristic data in response to a switching control signal input through the normal/reverse characteristic switching terminal 43 and referring to the compensation table 42 with an amplitude of a quadrature modulating digital signal calculated by an amplitude calculating portion 15 set to be an index, it is possible to obtain distortion data for compensating for a nonlinear distortion in the high power amplifier 13.

In the embodiment, in the case in which the high power amplifier 13 is operated in a saturation mode, the switching control signal to be input from a control portion 30 to the normal/reverse characteristic switching terminal 43 is set to have a normal characteristic, thereby multiplying a baseband quadrature modulating digital signal input from an I input terminal 31 and a Q input terminal 32 in a distortion compensating portion 17 by distortion data on a normal characteristic which are output from the compensation table 42. By adding a nonlinear distortion which is equivalent to that in the use of the high power amplifier 13 in a linear mode and compressing a peak factor of a modulating signal, consequently, it is possible to increase an efficiency of a polar coordinate modulation, thereby enhancing a power amplification efficiency.

In the case in which the high power amplifier 13 is operated in the linear mode, moreover, an output of an amplitude modulating portion 14 is fixed and the switching control signal to be input to the normal/reverse characteristic switching terminal 43 is set to have the reverse characteristic. Consequently, the baseband quadrature modulating digital signal input from the I input terminal 31 and the Q input terminal 32 in the distortion compensating portion 17 is multiplied by distortion data on a reverse characteristic output from the compensation table 42. By adding a reverse distortion characteristic of the high power amplifier 13 to carry out a nonlinear distortion compensation of the high power amplifier 13, thus, it is possible to enhance the power amplification efficiency.

The normal characteristic data of the compensation table 42 are not restricted to the distortion characteristic of the high power amplifier 13 but a distortion characteristic of an optional amplifier can be used. While the gain control of the high power amplifier is carried out on the power input level in the example of the structure, moreover, it may be variable on a gate or base bias input level. While the quadrature modulation to the RF band is carried out by means of the quadrature modulator, furthermore, it is apparent that the same modulation may be carried out by phase modulating means such as a direct modulator, an indirect PLL modulator or a ΔΣ modulator used in a constant amplitude modulating system such as a GSM method of European cell phones.

In the second embodiment, thus, it is possible to constitute the distortion compensating portion by only the multiplying function by switching the distortion data on the normal characteristic and the reverse characteristic which are prepared in place of the switching execution for the multiplication and the division of the distortion data when switching the addition of the nonlinear distortion in the saturation mode and the load of the reverse distortion characteristic in the linear mode. Accordingly, a dividing function can be omitted in the distortion compensating portion. Therefore, it is possible to relieve a processing load of the distortion compensating portion in addition to the advantages of the first embodiment.

Third Embodiment

FIG. 7 is a block diagram showing a structure of a transmitter according to a third embodiment of the invention. A transmitting portion 50 according to the third embodiment is partially different from the structure according to the first embodiment and a compensation calculating portion 51 for carrying out a distortion compensation in an amplitude component is provided.

The compensation calculating portion 51 is constituted to have an amplitude calculating portion 15 for calculating an amplitude of a baseband quadrature modulating digital signal, a distortion table 52 storing distortion data on an amplitude component, and a distortion adding portion 53 for adding the distortion data transferred from the distortion table 52 to the amplitude output from the amplitude calculating portion 15 and supplying them to an amplitude modulating portion 14. The other structures are the same as those in the first embodiment, and the same components have the same reference numerals and description will be omitted.

Figures 8, 9:
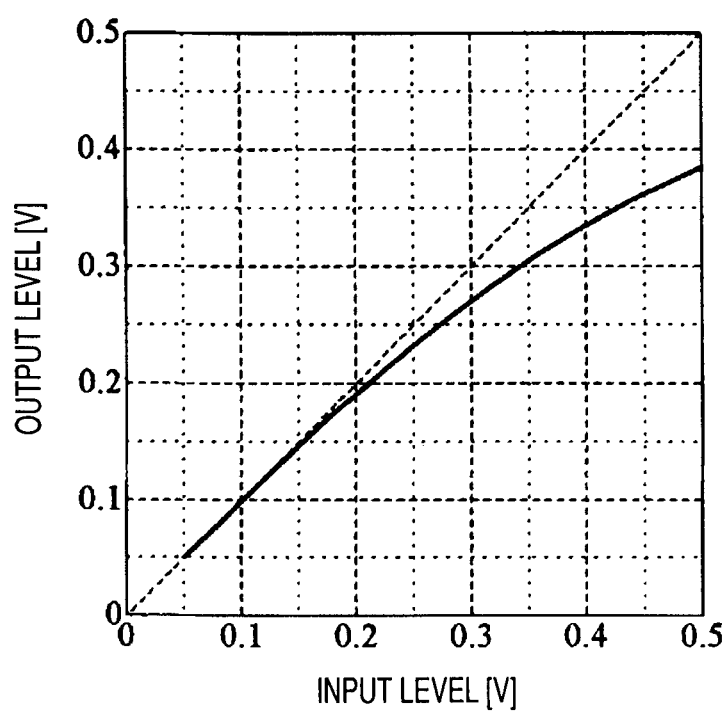
[FIG. 8] A diagram showing an example of a structure of a distortion table to be used in the third embodiment.
[FIG. 9] A characteristic chart showing, in a graph, an example of data to be stored in the distortion table according to the third embodiment.

FIG. 8 is a diagram showing an example of a structure of the distortion table 52 to be used in the third embodiment and FIG. 9 is a characteristic chart showing, in a graph, an example of data to be stored in the distortion table 52 in FIG. 8. The distortion table 52 is equivalent to an example of compensation data storage means and stores, as distortion data on an amplitude component, distortion data on an output level corresponding to each input level of a high power amplifier 13. By referring to the distortion table 52 with an amplitude of a quadrature modulating digital signal calculated by the amplitude calculating portion 15 set to be an index, it is possible to obtain distortion data for adding a nonlinear distortion in the high power amplifier 13.

The distortion adding portion 53 multiplies an amplitude of a baseband quadrature modulating digital signal output from the amplitude calculating portion 15 by amplitude distortion data to be the output of the distortion table 52 and adds a nonlinear distortion to an amplitude component of an input signal.

In the embodiment, in the case in which the high power amplifier 13 is operated in a saturation mode, the amplitude of the baseband quadrature modulating digital signal input through an I input terminal 31 and a Q input terminal 32 is calculated in the amplitude calculating portion 15 and the amplitude signal thus calculated is multiplied by the distortion data output from the distortion table 52 in the distortion adding portion 53. By adding a nonlinear distortion which is equivalent to that in the use of the high power amplifier 13 in a linear mode and compressing a peak factor of a modulating signal, consequently, it is possible to increase an efficiency of a polar coordinate modulation, thereby enhancing a power amplification efficiency.

In the case in which the high power amplifier 13 is operated in a linear mode, moreover, an output of the amplitude modulating portion 14 is fixed and the baseband quadrature modulating digital signal input through the I input terminal 31 and the Q input terminal 32 is exactly input to a quadrature modulator 19 of a linear modulator 12. An output of the linear modulator 12 is linearly amplified in the high power amplifier 13.

While the gain control of the high power amplifier 13 is carried out on the power input level in the example of the structure, it may be variable on a gate or base bias input level. While the quadrature modulation to the RF band is carried out by means of the quadrature modulator, moreover, it is apparent that the same modulation may be carried out by phase modulating means such as a direct modulator, an indirect PLL modulator or a ΔΣ modulator used in a constant amplitude modulating system such as a GSM method of European cell phones.

In the third embodiment, thus, when a nonlinear distortion is to be added in the saturation mode, the distortion data are added to an amplitude component of an input modulating signal to be supplied as a power supply to the high power amplifier 13. Consequently, it is possible to carry out a distortion compensation. By providing only amplitude data as the distortion data for the distortion compensation, thus, it is possible to reduce a scale of a distortion table. Moreover, the distortion compensation is not carried out in the linear mode. Consequently, it is possible to cause the structure of the circuit to be simpler than that in the first embodiment.

Fourth Embodiment

Figure 10:
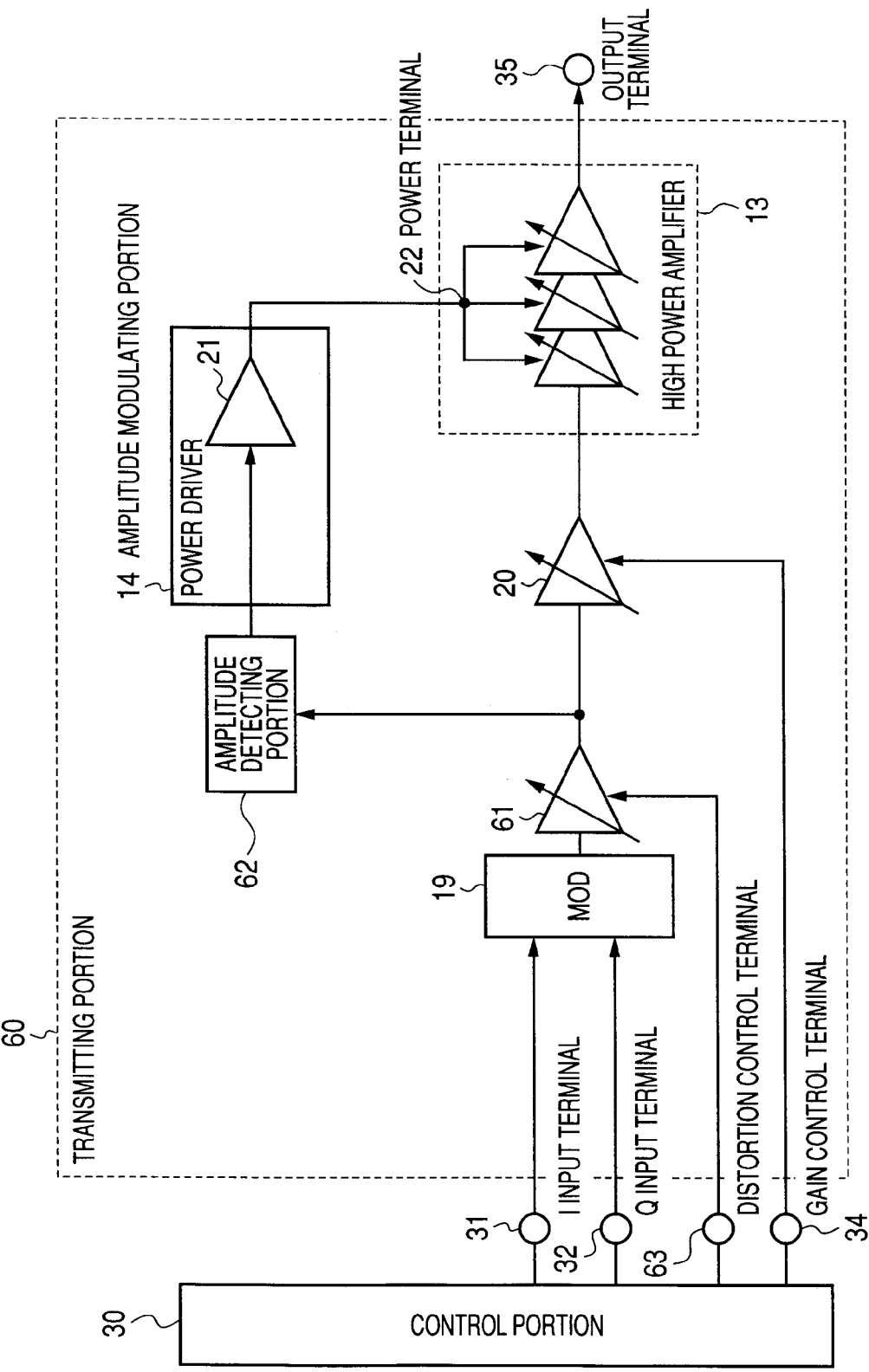
[FIG. 10] A block diagram showing a structure of a transmitter according to a fourth embodiment of the invention.

FIG. 10 is a block diagram showing a structure of a transmitter according to a fourth embodiment of the invention. A transmitting portion 60 according to the fourth embodiment is partially different from the structure according to the first embodiment and a medium power amplifier 61 is provided to give a nonlinear distortion on an analog basis.

The transmitting portion 60 includes the medium power amplifier 61 between an quadrature modulator 19 and a medium power amplifier 20, and the medium power amplifier 61 is provided with a distortion control terminal 63 for inputting a distortion control signal. Moreover, an amplitude detecting portion 62 is connected to an output terminal of the medium power amplifier 61, and an output of the amplitude detecting portion 62 is supplied to an amplitude modulating portion 14. The other structures are the same as those in the first embodiment, and the same components have the same reference numerals and description will be omitted.

The medium power amplifier 61 has a gain constituted variably in response to a distortion control signal input from the distortion control terminal 63, and regulates the gain in order to distort an output of the quadrature modulator 19 on an analog basis within such a range as to satisfy radio standards, thereby amplifying an amplitude without using a compensation table. The amplitude detecting portion 62 detects an amplitude of a signal output from the medium power amplifier 61 and outputs an amplitude component thus detected to the amplitude modulating portion 14. At this time, a gain of an input signal system is changed by the medium power amplifier 61. By regulating a gain of the medium power amplifier 20 in response to a gain control signal input through a gain control terminal 34, therefore, an output level is regulated again in the medium power amplifier 20 in order to cause an input level to a high power amplifier 13 to be proper.

While the gain control of the high power amplifier 13 is carried out on the power input level in the example of the structure, it may be variable on a gate or base bias input level. While a quadrature modulation to an RF band is carried out by means of the quadrature modulator, moreover, it is apparent that the same modulation may be carried out by phase modulating means such as a direct modulator, an indirect PLL modulator or a ΔΣ modulator used in a constant amplitude modulating system such as a GSM method of European cell phones.

In the fourth embodiment, thus, it is possible to carry out the distortion compensation by giving the nonlinear distortion on the analog basis by means of the medium power amplifier 61. By providing the amplifier for the distortion compensation, thus, it is not necessary to employ a compensation table. Consequently, it is possible to cause the structure of the circuit to be simpler than that in the third embodiment.

Fifth Embodiment

Figure 11:
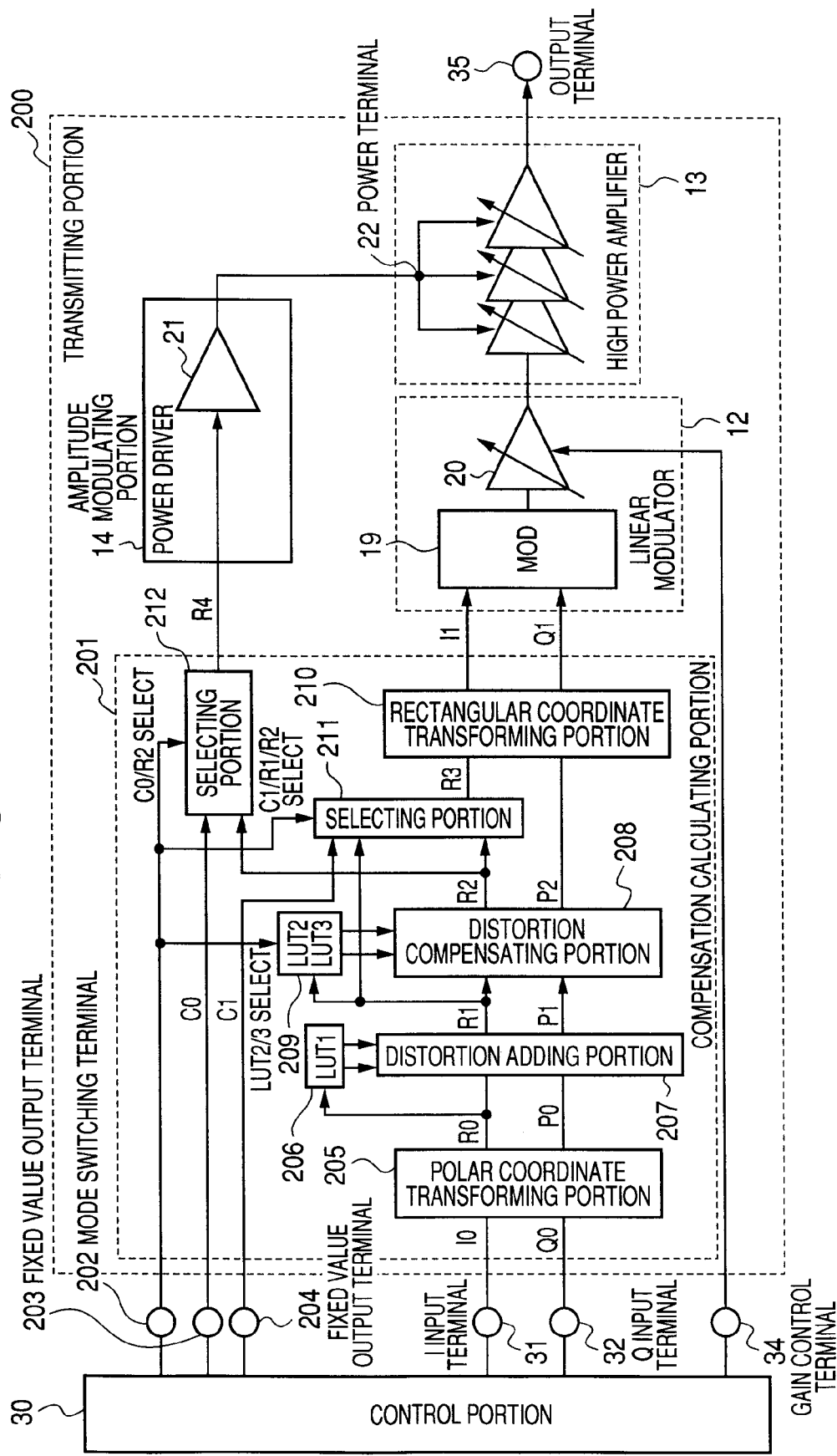
[FIG. 11] A block diagram showing a structure of a transmitter according to a fifth embodiment of the invention.
Figure 12:
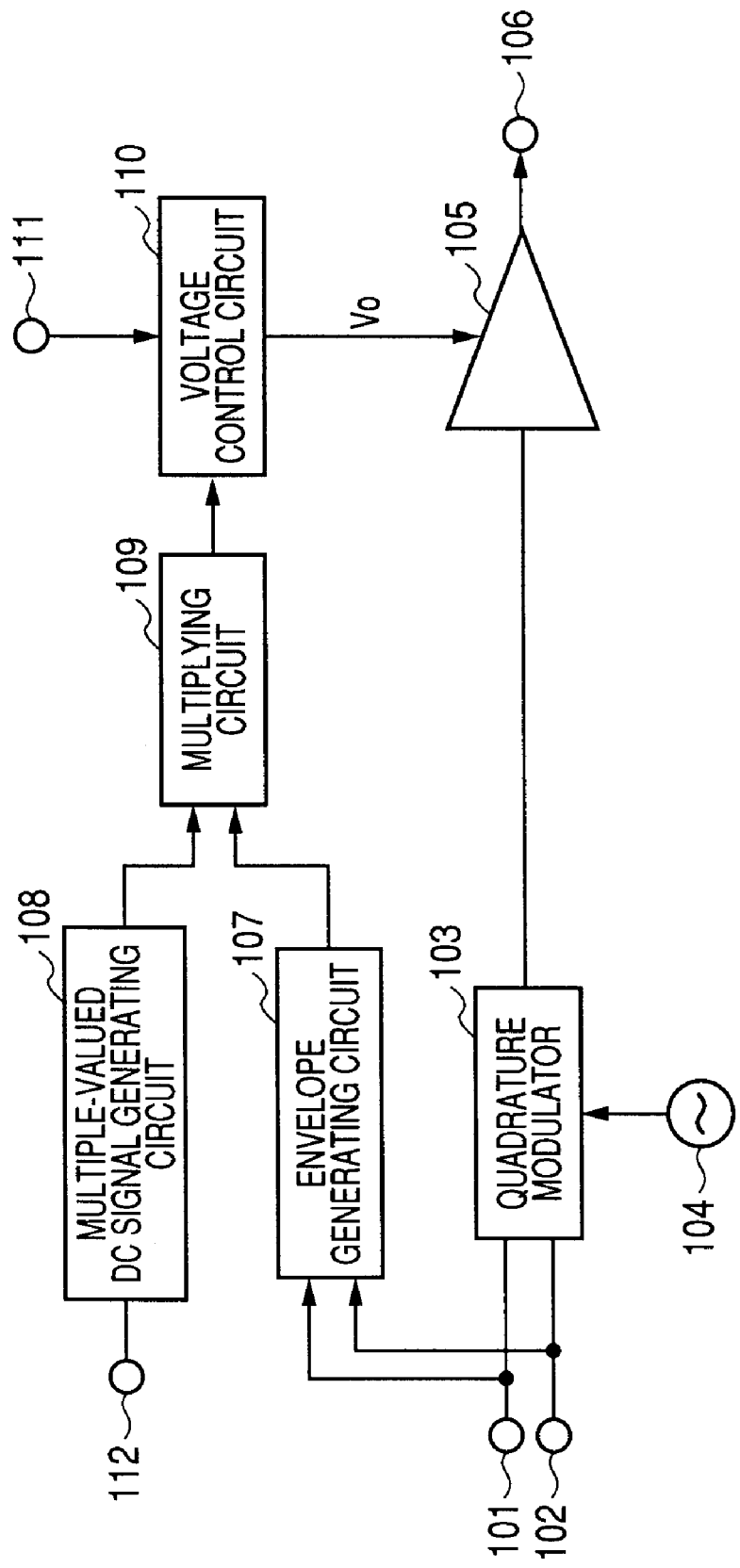
[FIG. 12] A block diagram showing a structure of an output variable transmitter according to a related example.

FIG. 11 is a block diagram showing a structure of a transmitter according to a fifth embodiment of the invention. A transmitting portion 200 according to the fifth embodiment is partially different from the structure according to the first embodiment and a structure of a compensation calculating portion 41 is changed.

A compensation calculating portion 201 is constituted to have a polar coordinate transforming portion 205, a distortion table (LUT1) 206, a distortion adding portion 207, a compensation table (LUT2, LUT3) 209, a distortion compensating portion 208, a first selecting portion 212, a second selecting portion 211, and a rectangular coordinate transforming portion 210. The other structures are the same as those in the first embodiment, and the same components have the same reference numerals and description will be omitted.

The polar coordinate transforming portion 205 carries out a polar coordinate transformation for baseband quadrature modulating digital signals I0 and Q0 and transforms them into an amplitude signal R0 and a phase signal P0. The distortion table 206 stores normal characteristic distortion data on an output level and a phase which correspond to each input level of a high power amplifier 13. The distortion adding portion 207 sets the amplitude signal R0 as a parameter and adds a distortion to the amplitude signal R0 and the phase signal P0 depending on the contents of the distortion table 206.

The compensation table 209 stores two data, that is, reverse characteristic distortion data on the output level and the phase which correspond to each input level of the high power amplifier 13 and reverse characteristic data on the output level and the phase which correspond to a power terminal input level of the high power amplifier 13, and either of the data are selected in response to an operation mode switching signal sent from a mode switching terminal 202. The distortion compensating portion 208 sets an amplitude signal R1 as a parameter and carries out a distortion compensation for the amplitude signal R1 and a phase signal P1 depending on the selected contents of the compensation table 209.

The first selecting portion 212 selects either an output C0 of a first fixed value output terminal 203 or an amplitude output R2 of the distortion compensating portion 208 in response to the operation mode switching signal sent from the mode switching terminal 202, and carries out a DA conversion to output an analog voltage. The second selecting portion 211 selects any of an output C1 of a second fixed value output terminal 204, the amplitude output R1 of the distortion adding portion 207 and the amplitude output R2 of the distortion compensating portion 208 in response to the operation mode switching signal sent from the mode switching terminal 202. The rectangular coordinate transforming portion 210 transforms an amplitude output R3 of the second selecting portion 211 and a phase output P2 of the distortion compensating portion 208 into an in-phase component and a quadrature component and then carries out the DA conversion to output them as analog voltages I1 and Q1.

An example of a structure of the distortion table 206 is identical to that in FIG. 2, and FIG. 3 is a characteristic chart showing, in a graph, an example of normal characteristic data to be stored. Moreover, both of examples of structures of two tables in the compensation table 209 are the same as those in case of the reverse characteristic in FIG. 5, and FIG. 6(B) is a characteristic chart showing, in a graph, an example of reverse characteristic data to be stored.

In the fifth embodiment, the distortion adding means and the distortion compensating means are provided independently. Consequently, it is possible to carry out a nonlinear distortion compensation by using a polar coordinate modulation or a simple predistortion method while compressing a peak factor of a modulating signal by the distortion adding means. Thus, it is possible to enhance a power amplification efficiency more greatly than that in each of the first to fourth embodiments.

In the case in which the polar coordinate modulating operation is carried out in a WLAN system communication having a wide transmission band, for example, a high-speed WLAN (IEEE802.11a/b/g) in the structure, the amplitude signal input R3 to the rectangular coordinate transforming portion 210 is set to be the amplitude output R1 of the distortion adding portion 207. Consequently, a band limitation in a control portion 30 is effective so that an upper limit of an operating frequency of a DA converter in the rectangular coordinate transforming portion can be suppressed.

In a cellular system communication having a small transmission band, for example, a radio communication using a cellular method such as GSM or EDGE, moreover, the output C1 of the second fixed value output terminal 204 is selected and input to the rectangular coordinate transforming portion 210. Consequently, the upper limit of the operating frequency of the internal DA converter is increased. By a removal of an amplitude component, however, a polar coordinate operation approaches an ideal state so that it is possible to satisfy strict modulation spectrum specifications of 60 dBc or more in 600 KHz detuning. In the case in which priority is given to a reduction in the operating frequency of the DA converter, it is apparent that the amplitude output R1 of the distortion adding portion 207 may be selected also in use in the cellular system communication.

The transmitter according to each of the embodiments can be applied to transmitting portions of various radio communicating devices such as various cell phone devices using a cellular method, for example, a GSM method or a W-CDMA method, other radio terminal devices, other radio base station devices and various radio communicating devices for a WLAN using the IEEE802.11a/b/g.

While the invention has been described in detail with reference to the specific embodiments, it is apparent to the skilled in the art that various changes and modifications can be made without departing from the spirit and scope of the invention.

The application is based on Japanese Patent Application (Japanese Patent Application No. 2004-055913) filed on Mar. 1, 2004 and Japanese Patent Application (Japanese Patent Application No. 2004-365578) filed on Dec. 17, 2004, and the contents are incorporated by reference.

INDUSTRIAL APPLICABILITY

The invention has an advantage that a transmitting portion capable of carrying out a highly efficient polar coordinate modulation while maintaining an excellent distortion characteristic can be provided, and is useful for a transmitter capable of amplifying a transmitting power using a polar coordinate modulation and a radio communicating device using the transmitter.

The invention claimed is:

1. A transmitter comprising:
   an amplitude calculating unit which calculates an amplitude of an input modulating signal;
   a distortion compensation data storage unit which stores distortion data on a normal characteristic or a reverse characteristic to carry out a distortion compensation for the input modulating signal;
   a distortion compensating unit which reads the distortion data on the normal characteristic or the reverse characteristic from the distortion compensation data storage unit based on an output of the amplitude calculating unit and multiplies or divides the input modulating signal and the distortion data to carry out the distortion compensation;
   a quadrature modulating unit which carries out a quadrature modulation in response to an output of the distortion compensating unit;
   a variable gain amplifying unit which amplifies an output of the quadrature modulating unit to control a gain based on a gain control signal;
   a power amplifying unit which serves to carry out a power amplification for an output of the variable gain amplifying unit and has a linear mode for carrying out the power amplification by using a linear operating region in an input/output power characteristic and a saturation mode for carrying out the power amplification by using a saturation operating region in the input/output power characteristic; and
   an amplitude modulating unit which inputs an amplitude component of the output of the distortion compensating unit to an output controlling input terminal of the power amplifying unit, thereby carries out a polar coordinate modulation,
   wherein the input modulating signal and the distortion data on the normal characteristic are multiplied or the input modulating signal and the distortion data on the reverse characteristic are divided in the distortion compensating unit in the case in which the power amplifying unit is operated in the saturation mode to carry out the polar coordinate modulation, and the input modulating signal and the distortion data on the normal characteristic are divided or the input modulating signal and the distortion data on the reverse characteristic are multiplied in the distortion compensating unit in the case in which the power amplifying unit is operated in the linear mode to carry out a linear amplification.

2. The transmitter according to claim 1, wherein the power amplifying unit carries out the polar coordinate modulation when a transmitting output power is on a maximum output level or in the vicinity thereof, and carries out the linear amplification when the transmitting output power is lower than the maximum output level.

3. The transmitter according to claim 1,
   wherein the power amplifying unit comprises a power terminal to be used as the output controlling input terminal; and
   wherein the transmitter further comprises a power driver which serves to increase a current capacity of the signal on the predetermined level or a signal subjected to an amplitude modulation based on the amplitude component of the input modulating signal and to supply a power as a transmitting output control signal to the power terminal.

4. A transmitter comprising:
   an amplitude calculating unit which calculates an amplitude of an input modulating signal;
   a normal and reverse distortion compensation data storage unit which stores distortion data on a normal characteristic and a reverse characteristic to carry out a distortion compensation for the input modulating signal;
   a distortion compensating unit which reads the distortion data on the normal characteristic or the reverse characteristic from the normal and reverse distortion compensation data storage unit based on an output of the amplitude calculating unit and multiplies the input modulating signal and the distortion data to carry out the distortion compensation;
   a quadrature modulating unit which carries out a quadrature modulation in response to an output of the distortion compensating unit;
   a variable gain amplifying unit which amplifies an output of the quadrature modulating unit to control a gain based on a gain control signal;
   a power amplifying unit which serves to carry out a power amplification for an output of the variable gain amplifying unit and has a linear mode for carrying out the power amplification by using a linear operating region in an input/output power characteristic and a saturation mode for carrying out the power amplification by using a saturation operating region in the input/output power characteristic; and
   an amplitude modulating unit which inputs an amplitude component of the output of the distortion compensating unit to an output controlling input terminal of the power amplifying unit, thereby carries out a polar coordinate modulation,
   wherein the input modulating signal and the distortion data on the normal characteristic are multiplied in the distortion compensating unit in the case in which the power amplifying unit is operated in the saturation mode to carry out the polar coordinate modulation, and the input modulating signal and the distortion data on the reverse characteristic are multiplied in the distortion compensation unit in the case in which the power amplifying unit is operated in the linear mode to carry out a linear amplification.

5. The transmitter according to claim 4, wherein the power amplifying unit carries out the polar coordinate modulation when a transmitting output power is on a maximum output level or in the vicinity thereof, and carries out the linear amplification when the transmitting output power is lower than the maximum output level.

6. The transmitter according to claim 4,
   wherein the power amplifying unit comprises a power terminal to be used as the output controlling input terminal; and
   wherein the transmitter further comprises a power driver which serves to increase a current capacity of the signal on the predetermined level or a signal subjected to an amplitude modulation based on the amplitude component of the input modulating signal and to supply a power as a transmitting output control signal to the power terminal.

7. A transmitter comprising:
a quadrature modulating unit which inputs an in-phase component and a quadrature component of an input modulating signal, thereby carries out a quadrature modulation;
a variable gain amplifying unit which amplifies an output of the quadrature modulating unit to control a gain based on a gain control signal;
a power amplifying unit which serves to carry out a power amplification for an output of The variable gain amplifying unit and has a linear mode for carrying out the power amplification by using a linear operating region in an input/output power characteristic and a saturation mode for carrying out the power amplification by using a saturation operating region in the input/output power characteristic;
an amplitude calculating unit which calculates an amplitude of the input modulating signal;
an amplitude modulating unit which inputs an amplitude component of the input modulating signal to an output controlling input terminal of the power amplifying unit, thereby carries out a polar coordinate modulation;
an amplitude distortion data storage unit which stores distortion data for the amplitude of the input modulating signal; and
a distortion adding unit which reads the distortion data from the amplitude distortion data storage unit based on an output of the amplitude calculating unit and multiplies the amplitude of the input modulating signal and the distortion data in the case in which the power amplifying unit is operated in the saturation mode to carry out the polar coordinate modulation.

8. The transmitter according to claim 7, wherein the power amplifying unit carries out the polar coordinate modulation when a transmitting output power is on a maximum output level or in the vicinity thereof, and carries out the linear amplification when the transmitting output power is lower than the maximum output level.

9. The transmitter according to claim 7,
wherein the power amplifying unit comprises a power terminal to be used as the output controlling input terminal; and
wherein the transmitter further comprises a power driver which serves to increase a current capacity of the signal on the predetermined level or a signal subjected to an amplitude modulation based on the amplitude component of the input modulating signal and to supply a power as a transmitting output control signal to the power terminal.

10. A transmitter comprising:
a quadrature modulating unit which inputs an in-phase component and a quadrature component of an input modulating signal, thereby carries out a quadrature modulation;
a first variable gain amplifying unit which a distortion control which serves to amplify an output of the quadrature modulating unit, thereby controls a gain based on a distortion control signal;
a second variable gain amplifying unit for a gain control which serves to amplify an output of the first variable gain amplifying unit, thereby controls a gain based on a gain control signal;
a power amplifying unit which serves to carry out a power amplification for an output of the second variable gain amplifying unit and has a linear mode for carrying out the power amplification by using a linear operating region in an input/output power characteristic and a saturation mode for carrying out the power amplification by using a saturation operating region in the input/output power characteristic;
an amplitude detecting unit which detects an amplitude of the output of the first variable gain amplifying unit; and
an amplitude modulating unit which inputs an output of the amplitude detecting unit to an output controlling input terminal of the power amplifying unit, thereby carries out a polar coordinate modulation.

11. The transmitter according to claim 10, wherein the power amplifying unit carries out the polar coordinate modulation when a transmitting output power is on a maximum output level or in the vicinity thereof, and carries out the linear amplification when the transmitting output power is lower than the maximum output level.

12. The transmitter according to claim 10,
wherein the power amplifying unit comprises a power terminal to be used as the output controlling input terminal; and
wherein the transmitter further comprises a power driver which serves to increase a current capacity of the signal on the predetermined level or a signal subjected to an amplitude modulation based on the amplitude component of the input modulating signal and to supply a power as a transmitting output control signal to the power terminal.

13. A transmitter comprising:
a polar coordinate transforming portion for transforming an input modulating signal constituted by an in-phase component and a quadrature component into an amplitude signal and a phase signal;
a distortion data storage unit which stores distortion data to add a distortion to the amplitude signal and the phase signal;
a distortion adding unit which reads the distortion data from the distortion data storage unit based on the amplitude signal and adds a distortion to the amplitude signal and the phase signal;
a distortion compensation data storage unit which stores two types of distortion data to carry out a distortion compensation for amplitude signal and phase signal outputs of the distortion adding unit;
a distortion compensating unit which selects and reads any of the distortion data from the distortion compensation data storage unit based on the amplitude signal output of the distortion adding unit and carries out a distortion compensation for the amplitude signal and phase signal outputs of the distortion adding unit;
a rectangular coordinate transforming unit which transforms any of an amplitude signal output of the distortion compensating unit, a fixed value output and the amplitude signal output of the distortion adding unit and a phase signal output of the distortion compensating unit into an in-phase component and a quadrature component;
a quadrature modulating unit which carries out a quadrature modulation in response to an output of the rectangular coordinate transforming unit;
a variable gain amplifying unit which amplifies an output of the quadrature modulating unit to control a gain based on a gain control signal;

a power amplifying unit which serves to carry out a power amplification for an output of the variable gain amplifying unit and has a linear mode for carrying out the power amplification by using a linear operating region in an input/output power characteristic and a saturation mode for carrying out the power amplification by using a saturation operating region in the input/output power characteristic; and an amplitude modulating unit which inputs an amplitude component of the output of the distortion compensating unit to an output controlling input terminal of the power amplifying unit, thereby carries out a polar coordinate modulation, wherein an amplitude signal input to the rectangular coordinate transforming unit is set to be the fixed value or the amplitude output in the distortion adding unit in the case in which the power amplifying unit is operated in the saturation mode to carry out the polar coordinate modulation, and is set to be the amplitude output in the distortion compensating unit in the case in which the power amplifying unit is operated in the linear mode to carry out a linear amplification.

14. The transmitter according to claim 13, wherein when the power amplifying unit is to be operated in the saturation mode to carry out the polar coordinate modulation, the amplitude signal input to the rectangular coordinate transforming unit is set to be a fixed value if an operating mode is a cellular system communication and is set to be an amplitude output in the distortion adding unit in case of a WLAN system communication.

15. The transmitter according to claim 13, wherein the power amplifying unit carries out the polar coordinate modulation when a transmitting output power is on a maximum output level or in the vicinity thereof, and carries out the linear amplification when the transmitting output power is lower than the maximum output level.

16. The transmitter according to claim 13,
wherein the power amplifying unit comprises a power terminal to be used as me output controlling input terminal; and
wherein the transmitter further comprises a power driver which serves to increase a current capacity of the signal on the predetermined level or a signal subjected to an amplitude modulation based on the amplitude component of the input modulating signal and to supply a power as a transmitting output control signal to the power terminal.

17. A radio communicating device comprising the transmitter according to claim 13.

* * * * *

UNITED STATES PATENT AND TRADEMARK OFFICE
CERTIFICATE OF CORRECTION

PATENT NO.        : 7,496,334 B2
APPLICATION NO. : 10/598434
DATED              : February 24, 2009
INVENTOR(S)      : Noriaki Saito Page 1 of 1

It is certified that error appears in the above-identified patent and that said Letters Patent is hereby corrected as shown below:

In column 15, line 40 please delete "10" and insert therefor --I0--.

In column 19, line 14 please delete "The" and insert therefor --the--.

In column 22, line 14 please delete "me" and insert therefor --the--.

Signed and Sealed this

Fifth Day of May, 2009

JOHN DOLL
*Acting Director of the United States Patent and Trademark Office*